(12) United States Patent
Kucera et al.

(10) Patent No.: US 8,473,229 B2
(45) Date of Patent: Jun. 25, 2013

(54) STORAGE DEVICE ENERGIZED ACTUATOR HAVING DIAGNOSTICS

(75) Inventors: David Kucera, Bilovice nad Svitavou (CZ); Pavel Kania, Brno (CZ); Shanna Lorraine Leeland, St. Paul, MN (US); Peter Anderson, St. Paul, MN (US)

(73) Assignee: Honeywell International Inc., Morristown, NJ (US)

( * ) Notice: Subject to any disclaimer, the term of this patent is extended or adjusted under 35 U.S.C. 154(b) by 371 days.

(21) Appl. No.: 12/770,908

(22) Filed: Apr. 30, 2010

(65) Prior Publication Data

US 2011/0270544 A1 Nov. 3, 2011

(51) Int. Cl.
*G01R 11/00* (2006.01)
*G01R 11/17* (2006.01)
*G01R 11/22* (2006.01)
*G01R 11/25* (2006.01)

(52) U.S. Cl.
USPC .................... 702/58; 702/59; 702/60; 702/64

(58) Field of Classification Search
USPC ............ 702/58, 64, 117, 151, 157, 179, 182, 702/187, 188, 63, 183, 185; 73/152.31; 219/69.18; 307/75; 315/291; 318/563; 324/750.3
See application file for complete search history.

(56) References Cited

U.S. PATENT DOCUMENTS

| | | |
|---|---|---|
| 3,708,737 A | 1/1973 | Johnson |
| 3,818,297 A | 6/1974 | Ha et al. |
| 3,847,350 A | 11/1974 | Thompson |
| 3,849,350 A | 11/1974 | Matsko |
| 4,204,833 A | 5/1980 | Kmetz et al. |
| 4,256,257 A | 3/1981 | Pinkerton |
| 4,267,965 A | 5/1981 | Everett |
| 4,299,554 A | 11/1981 | Williams |
| 4,324,944 A | 4/1982 | Weihrich et al. |
| RE30,936 E | 5/1982 | Kmetz et al. |
| 4,333,002 A | 6/1982 | Kozak |
| 4,390,123 A | 6/1983 | McCabe |
| 4,460,329 A | 7/1984 | Trent |
| 4,508,261 A | 4/1985 | Blank |
| 4,511,790 A | 4/1985 | Kozak |
| 4,538,980 A | 9/1985 | Hoyme |
| 4,588,875 A | 5/1986 | Kozak et al. |
| 4,692,598 A | 9/1987 | Yoshida et al. |
| 4,696,639 A | 9/1987 | Bohan, Jr. |
| 4,734,658 A | 3/1988 | Bohan, Jr. |

(Continued)

FOREIGN PATENT DOCUMENTS

| | | |
|---|---|---|
| EP | 0356609 | 3/1990 |
| GB | 2211331 | 6/1989 |

OTHER PUBLICATIONS

U.S. Appl. No. 12/553,795, filed Sep. 3, 2009.
U.S. Appl. No. 12/769,081, filed Apr. 28, 2010.

(Continued)

*Primary Examiner* — Michael Nghiem
*Assistant Examiner* — Felix Suarez
(74) *Attorney, Agent, or Firm* — Seager Tufte & Wickhem LLC.

(57) ABSTRACT

A system having unified diagnostics where an electrical energy storage device may supply an actuator. Various techniques may be used to determine energy storage capacity and actuator current usage. Measured storage capacity and actuator current may indicate the health of the energy storage device and the actuator, respectively. Also, operation of a service switch for the actuator may be checked relative to its state.

23 Claims, 8 Drawing Sheets

U.S. PATENT DOCUMENTS

| | | | |
|---|---|---|---|
| 4,742,210 A | 5/1988 | Tsuchiyama et al. | |
| 4,752,210 A | 6/1988 | Trent | |
| 4,770,629 A | 9/1988 | Bohan, Jr. | |
| 4,778,378 A | 10/1988 | Dolnick et al. | |
| 4,834,284 A | 5/1989 | Vandermeyden | |
| 4,835,670 A | 5/1989 | Adams et al. | |
| 4,880,376 A | 11/1989 | Bartels et al. | |
| 4,984,981 A | 1/1991 | Pottebaum | |
| 4,986,468 A | 1/1991 | Deisinger | |
| 5,007,156 A | 4/1991 | Hurtgen | |
| 5,039,006 A | 8/1991 | Habegger | |
| 5,063,775 A * | 11/1991 | Walker et al. | 73/152.31 |
| 5,276,630 A | 1/1994 | Baldwin et al. | |
| 5,442,157 A | 8/1995 | Jackson | |
| 5,612,629 A | 3/1997 | Mullin et al. | |
| 5,622,200 A | 4/1997 | Schulze | |
| 5,652,525 A | 7/1997 | Mullin et al. | |
| 5,660,328 A | 8/1997 | Momber | |
| 5,744,923 A * | 4/1998 | Strauss et al. | 318/563 |
| 5,797,358 A | 8/1998 | Brandt et al. | |
| 5,896,089 A | 4/1999 | Bowles | |
| 5,968,393 A | 10/1999 | Demaline | |
| 5,975,884 A | 11/1999 | Dugger | |
| 6,048,193 A | 4/2000 | Juntunen et al. | |
| 6,053,130 A | 4/2000 | Shellenberger | |
| 6,059,195 A | 5/2000 | Adams et al. | |
| 6,208,806 B1 | 3/2001 | Langford | |
| 6,257,871 B1 | 7/2001 | Weiss et al. | |
| 6,261,087 B1 | 7/2001 | Bird et al. | |
| 6,271,505 B1 | 8/2001 | Henderson | |
| 6,293,471 B1 | 9/2001 | Stettin et al. | |
| 6,350,967 B1 | 2/2002 | Scott | |
| RE37,745 E | 6/2002 | Brandt et al. | |
| 6,560,409 B2 | 5/2003 | Troost, IV | |
| 6,644,957 B2 | 11/2003 | Weiss | |
| 6,684,821 B2 | 2/2004 | Lannes et al. | |
| 6,701,874 B1 | 3/2004 | Schultz et al. | |
| 6,838,847 B2 | 1/2005 | Dragoni et al. | |
| 6,880,493 B2 | 4/2005 | Clifford | |
| 6,934,862 B2 | 8/2005 | Sharood et al. | |
| 6,955,301 B2 | 10/2005 | Munsterhuis et al. | |
| 6,959,876 B2 | 11/2005 | Chian et al. | |
| 7,061,263 B1 * | 6/2006 | Ong | 324/750.3 |
| 7,176,648 B2 * | 2/2007 | Choi | 318/625 |
| 7,205,737 B1 | 4/2007 | Bilodeau | |
| 7,205,892 B2 | 4/2007 | Luebke et al. | |
| 7,221,862 B1 | 5/2007 | Miller et al. | |
| 7,252,502 B2 | 8/2007 | Munsterhuis | |
| 7,275,533 B2 | 10/2007 | Soeholm et al. | |
| 7,317,265 B2 | 1/2008 | Chian et al. | |
| 7,712,677 B1 | 5/2010 | Munsterhuis et al. | |
| 7,721,972 B2 | 5/2010 | Bracken et al. | |
| 7,747,358 B2 | 6/2010 | Troost et al. | |
| 7,804,047 B2 | 9/2010 | Zak et al. | |
| 7,812,277 B2 * | 10/2010 | Buhler et al. | 219/69.18 |
| 8,026,673 B2 * | 9/2011 | Lys | 315/291 |
| 8,297,524 B2 * | 10/2012 | Kucera et al. | 236/1 G |
| 2006/0152085 A1 * | 7/2006 | Flett et al. | 307/75 |
| 2006/0214015 A1 | 9/2006 | Furukawa et al. | |
| 2007/0023333 A1 | 2/2007 | Mouhebaty et al. | |
| 2009/0230338 A1 * | 9/2009 | Sanders et al. | 251/129.01 |

OTHER PUBLICATIONS

Honeywell D896 Automatic Vent Damper, Product Data, 12 pages, 1997.

Honeywell S8610U Universal Intermittent Pilot Module, Installation Instructions, 20 pages, Aug. 1996.

Johnson Controls Q135 Automatic Flue Damper System, 8 pages, 1998.

Lennox, "Network Control Panel (NCP), User's Manual," 18 pages, Nov. 1999.

Weil-McLain, Technical Services Bulletin No. SB201, 2 pages, Nov. 20, 2002.

* cited by examiner

STORAGE DEVICE ENERGIZED ACTUATOR HAVING DIAGNOSTICS

The present application is related to U.S. patent application Ser. No. 12/553,795, filed Sep. 3, 2009, now U.S. Pat. No. 8,297,524, issued Oct. 30, 2012, and entitled "A Damper Control System". U.S. patent application Ser. No. 12/553,795, filed Sep. 3, 2009, now U.S. Pat. No. 8,297,524, issued Oct. 30, 2012, is hereby incorporated by reference.

BACKGROUND

The invention pertains to actuators and particularly to powering of actuators. More particularly, the invention pertains to diagnostics of actuator systems.

SUMMARY

The invention provides a system having unified diagnostics where an electrical energy storage device may supply an actuator. Various techniques may be used to determine energy storage capacity and actuator current usage. Measured storage capacity and actuator current may indicate the health of the energy storage device and the actuator, respectively. Also, operation of a service switch for the actuator may be checked relative to its state.

DESCRIPTION

Figure 1:
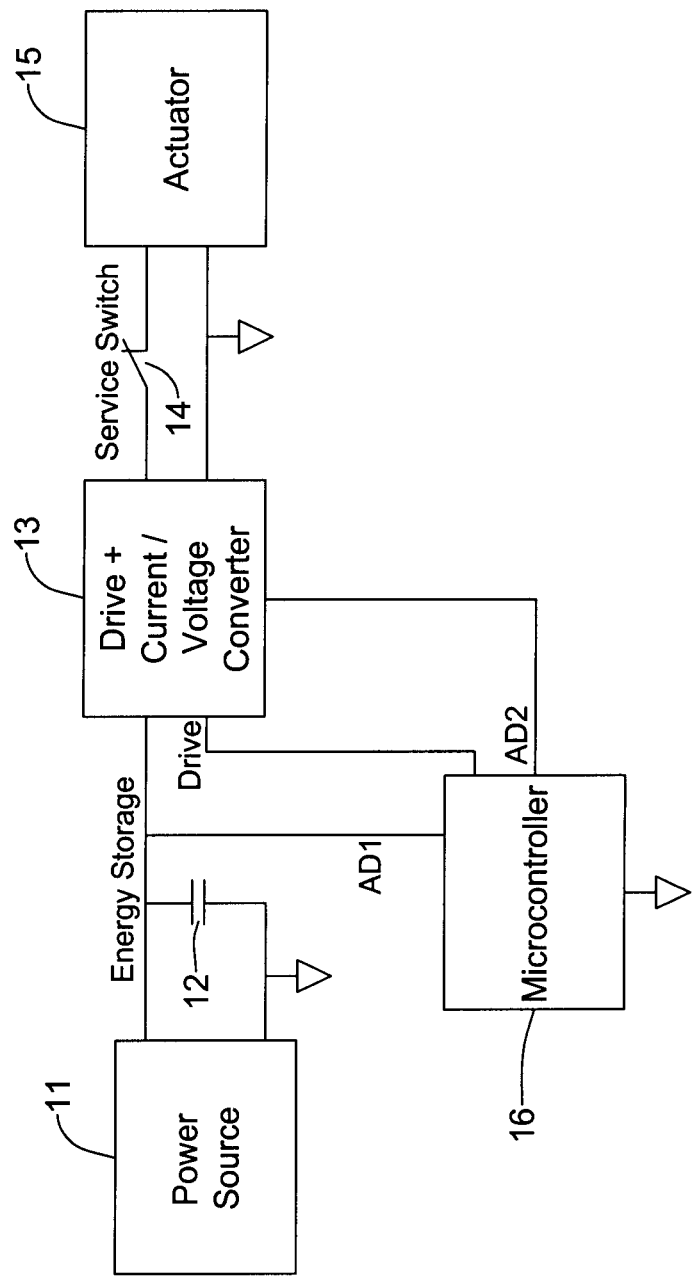
FIG. 1 is a diagram of one circuit of an energy storage powered actuator.

Capacitors of substantially large capacitance (also known as "super capacitors") are becoming commercially available. One of their target applications is to store energy when power is available from a power source and use the accumulated energy to drive an actuator even at times when power from the power source would otherwise be insufficient. The actuator may be utilized to drive or control a damper or valve in an HVAC system. The actuator may also be utilized to drive or control a damper or valve for a water heater, stove, another appliance or equipment. Other kinds of components may be driven or controlled by the actuator.

The capacitors may suffer gradual loss of energy storage capacity over time. There is a need to monitor this capacity and indicate if it becomes too low to drive the actuator when the need arises—otherwise the actuator may not be driven all the way to the desired position.

One way may be to measure and analyze the voltage across the energy storage device (e.g., capacitor) prior, during, and after driving the actuator. This voltage may be a measure of the health (e.g., capacity) of the energy storage device. However, the voltage may also depend on actuator current consumption which in turn may indicate the health of the actuator assembly.

Therefore, there is a need to distinguish clearly if it is the capacitor or the actuator that degrades, and to advise the user accordingly to either inspect the electronics control unit containing the capacitor or the actuator assembly, respectively. By providing accurate diagnostics, field maintenance can be optimized.

The actuator may also contain a "service switch" which allows the user to disable automatic actuator control, move the actuator to the desired position manually and leave it there. Therefore, there is another need, which is fulfilled by the present system, to detect the status of the service switch by the electronics control unit without adding extra components to it.

The voltage across the storage device (capacitor) drops when driving the actuator as the stored energy is consumed by the actuator. A larger voltage drop may indicate either loss of capacitance or increased actuator consumption. Therefore, actuator current is also measured to distinguish the two failure modes. The voltage drop and the actuator current are then combined to calculate the storage device capacitance.

If the capacitance drops substantially compared to either previously stored values or an absolute threshold, it is concluded that the storage device is compromised.

If the actuator current during actuator drive is increased substantially compared to either previously stored values or an absolute threshold, it is concluded that the actuator assembly is compromised.

If the actuator current is substantially zero during actuator drive, it is concluded that the service switch is open.

Alternatively, if the voltage across the storage device stays substantially constant during actuator drive, it is concluded that the service switch is open.

The techniques of monitoring voltage across storage device as well as current in an actuator may be used stand-alone. The present approach may combine the two measured values to provide accurate system diagnostics that indicate which system component needs maintenance.

The present scheme may be realized using an electronics circuit built around a microcontroller. The microcontroller may provide signals to drive the actuator, and use an analog-to-digital (AD) converter input to measure the voltage across the storage device. The microcontroller may also measure a voltage proportional to the actuator current by another AD converter input. This voltage may be obtained by a current-to-voltage conversion.

In one approach, a resistor in series with the actuator is used for the conversion. This technique may be used in the motor control field. In another approach, the conversion may be done by measuring a voltage drop across a known capacitor while disconnecting the actuator from the storage device temporarily. In this case, the microcontroller may provide signals to drive the measuring sequence and use the AD converter again to measure the voltages.

In case the actuator involves an electrical motor, yet another approach is possible where the actuator current may be monitored by measuring the back electromotive force (BEMF) generated by the motor while disconnecting the actuator from the storage device temporarily. Again, the microcontroller may provide signals to drive the measuring sequence and use the AD converter to measure the voltages.

The microcontroller may then calculate the storage device capacitance and actuator current based on measured voltages, compare the value to values stored during previous run cycles or to a suitable threshold, and decide if the storage device and/or the actuator assembly is compromised.

If the health of the storage device or the actuator is detected as insufficient to further position the actuator reliably, the microcontroller may decide to leave the actuator in a desirable position and indicate the failure to the user. For example, if diagnostics finds out that the capacitor or the actuator have failed such that moving a flue damper to the closed position can not be guaranteed, the system may decide to leave the flue damper open from that time on. This may allow the system to keep on working safely (flue is open) although with reduced energy efficiency (flue stays open even when a main valve is off and only a standing pilot flame is burning, heat escapes up the flue). User is notified but still gets hot water when needed so the repair is not urgent. If the system left the damper in closed position instead, the main valve would not be allowed to turn on and user would get no hot water and would need to get it repaired urgently.

The present system relates to a millivolt damper disclosed in U.S. patent application Ser. No. 12/553,795, filed Sep. 3, 2009, now U.S. Pat. No. 8,297,524, issued Oct. 30, 2012, which is hereby incorporated by reference.

FIG. 1 is a diagram of one scheme of the present approach. A power source 11 may have an output with energy storage provided by a capacitor 12. The output from power source 11 may go to a drive plus current/voltage converter 13. An output from converter 13 may go to a service switch 14. The service switch 14 may be connected to an actuator 15. Service switch 14 may allow a user to disconnect actuator 15 and drive it manually to a desired position and leave it there. A microcontroller 16 may provide a drive signal to the drive plus converter 13. The signal drive may be a control signal from microcontroller 16 that energizes actuator 15 and controls the current-to-voltage conversion. An AD1 line from microcontroller 16 may be connected to the energy storage line. An AD1 voltage may be a voltage signal corresponding to a voltage across an energy storage device 12. An AD2 voltage signal may correspond to the current sunk by actuator 15.

Figure 2:
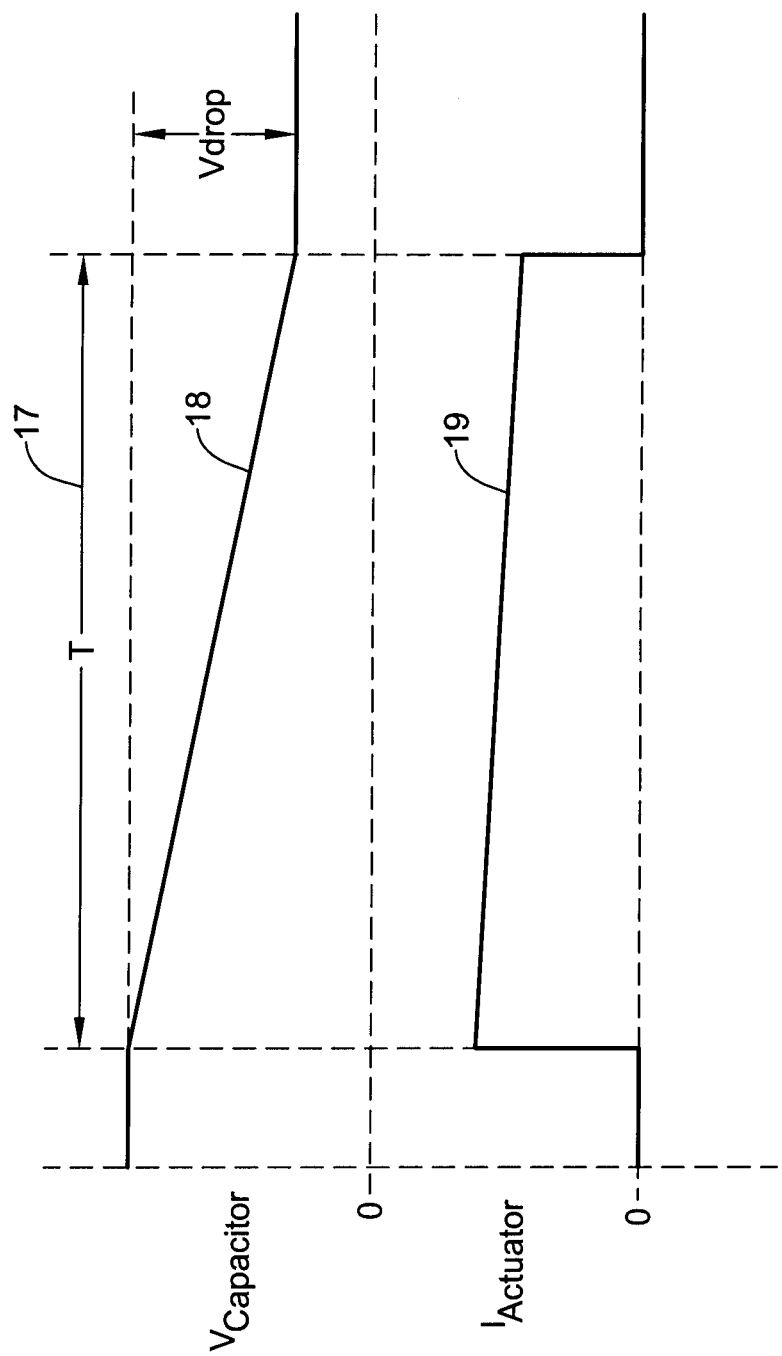
FIG. 2 is a diagram of a graph showing an example capacitor voltage and a signal representing an actuator current.

FIG. 2 is a diagram showing examples of signals for voltage across the energy storage device and current sunk by the actuator. Actuator 15 may be energized for a duration 17 of T time. Signal 18 corresponding to the voltage across the energy storage device 12 decreases as the storage device 12 is discharged by current going into actuator 15. Signal 18 may be read directly by AD1 line of the microcontroller. Signal 19 representing current sunk by actuator 15 is constructed from measurements taken on AD2 line of the microcontroller. Different versions of drive plus converter 13 may lead to different algorithms to construct signal 19, as will become apparent further below. Microcontroller 16 may take several samples of the AD1 and AD2 signals repeatedly during time 17.

The capacitance of storage device 12 may be estimated as:

$$C \approx \frac{\int_0^T I_{ACTUATOR}(t)dt}{V_{drop}} = \frac{Integral}{V_{drop}}. \quad (1)$$

Microcontroller 16 may implement an algorithm to approximate the value of the integral of equation (1).

Figure 3A:
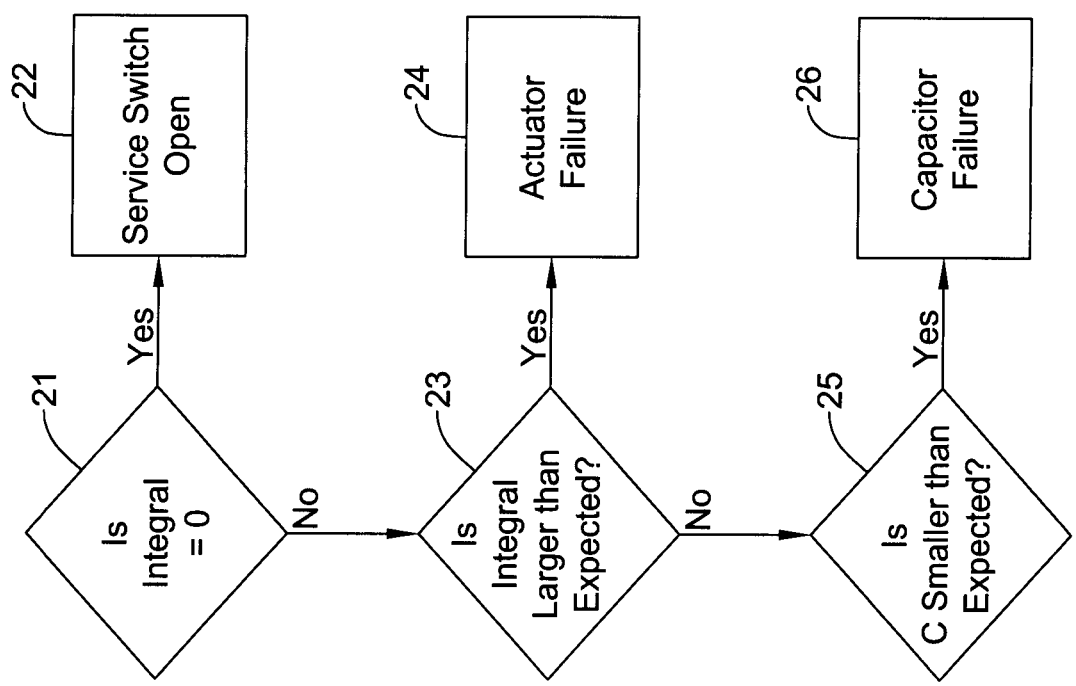
FIG. 3a is a flow diagram representing an illustrative example of a diagnostics algorithm.

An algorithm as diagrammed in FIG. 3a may be implemented. It may be regarded as a diagnostics algorithm. A question, whether the integral (of equation 1) is equal to zero, may be asked at symbol 21. If the answer is yes, then service switch 14 may be open, as shown at symbol 22. If the answer is no, then a question of whether the integral is equal to a value larger than expected, may be asked at symbol 23. If the answer is yes, then actuator 15 may have failed, as shown at symbol 24. If the answer is no, then a question of whether C of the integral equation is smaller than expected may be asked at symbol 25. If the answer is yes, then there may be a capacitor 12 failure, as indicated at symbol 26. If the answer is no, then the algorithm process may be stopped or repeated. It may be noted that it is unlikely that two of the failures noted by the algorithm in FIG. 3a would occur at the same time. Also, the order with which the questions are raised during algorithm execution may be changed as desired.

Figure 3B:
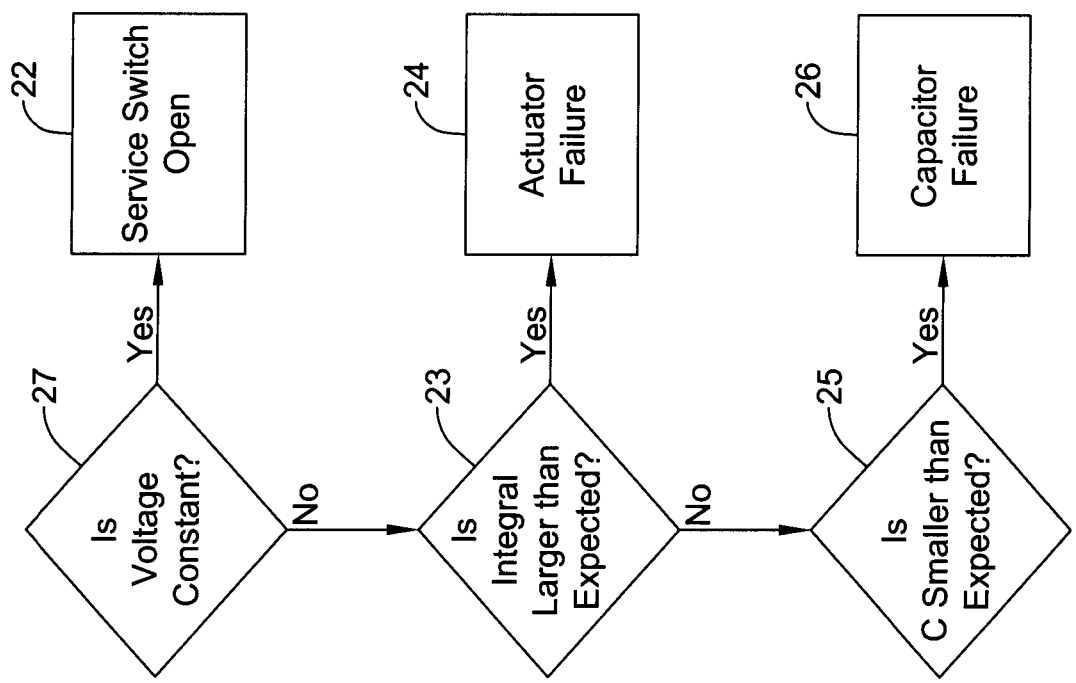
FIG. 3b is a flow diagram representing an illustrative example of a diagnostics algorithm.

An alternative algorithm as diagrammed in FIG. 3b may be implemented. The difference from the algorithm as diagramed in FIG. 3a is that symbol 21 is replaced with a symbol 27 in FIG. 3b which asks whether the voltage across the storage device is constant during an actuator drive. If the voltage is substantially constant, it is concluded that the service switch is open. Also, the order with which the questions are raised during algorithm execution may be changed as desired.

Figure 4:
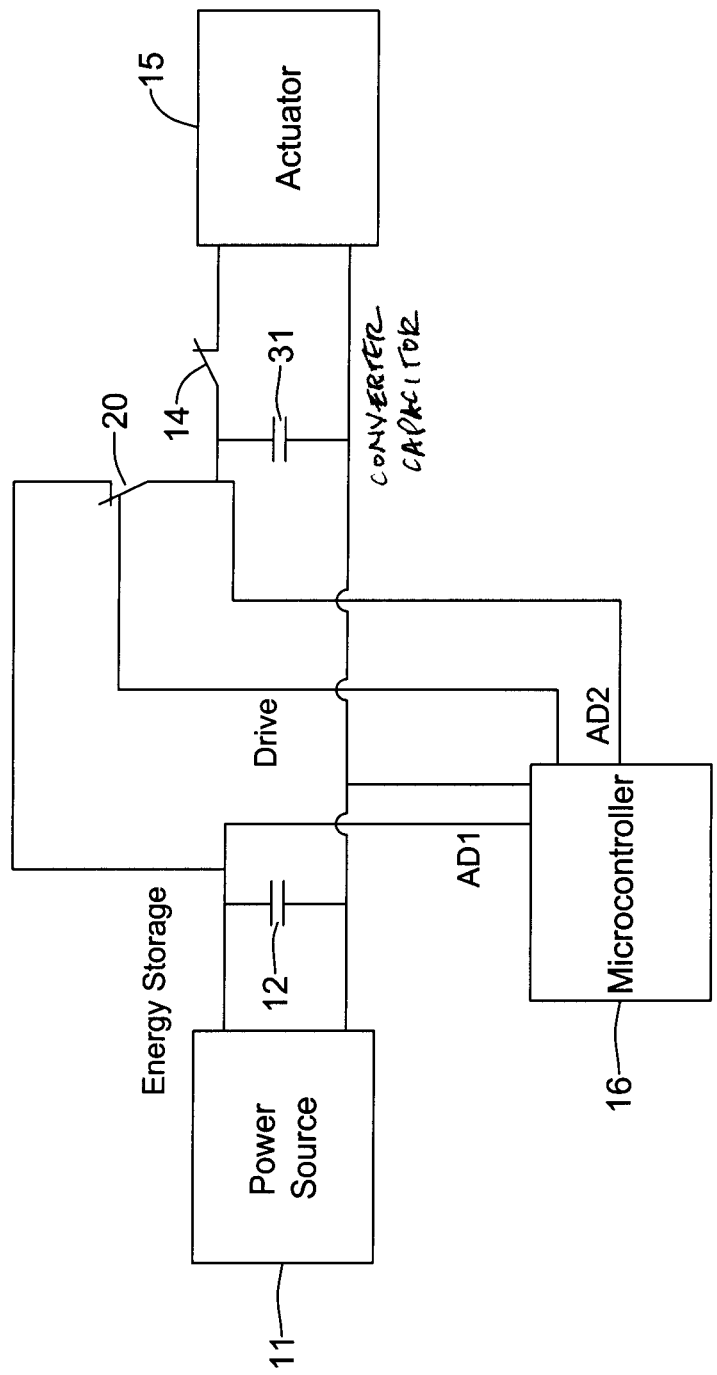
FIG. 4 is a diagram of one circuit of an energy storage powered actuator showing one possible version of a drive plus current/voltage converter.
Figure 5:
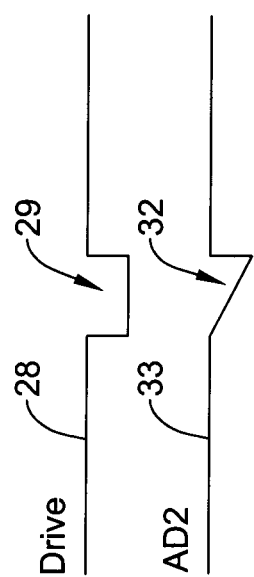
FIG. 5 is a diagram of a graph illustrating a determination of an actuator current according to a voltage signal on a capacitor.

FIGS. 4 and 5 are diagrams for illustrating a conversion of an actuator current to a representative voltage signal with a capacitor. While actuator 15 is being driven, microcontroller 16 may turn switch 20 off temporarily, as indicated by drive signal 28 of a diagram in FIG. 5. The diagram of FIG. 5 shows measurement signals taken during actuator current changes. A period of the switch being off is indicated by a notch 29 in drive signal 28. While switch 20 is off (i.e., open) and service switch 14 is on (i.e., closed), actuator 15 current then may discharge a converter capacitor 31 of a known capacitance at a rate proportional to the level of the actuator current, as shown by a discharge indication 32 on an AD2 signal 33. The current discharge rate may be measured by an A/D converter of microcontroller 16.

Figure 6:
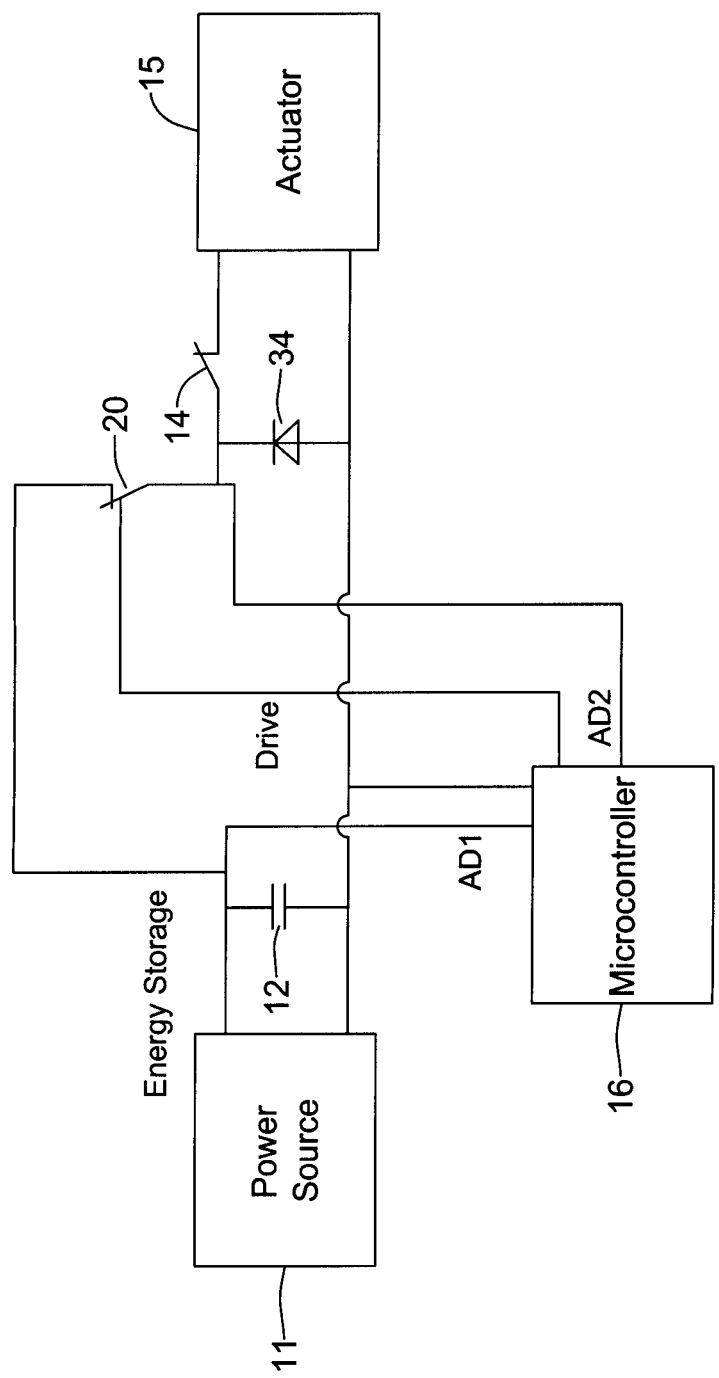
FIG. 6 is a diagram of one circuit of an energy storage powered actuator showing still another version of the drive and current/voltage converter.

Another way for measuring actuator current is by measuring back EMF in a situation where actuator 15 implements a motor. FIG. 6 is a diagram of a circuit which may be used for performing actuator current measurements from a back electromotive force. While actuator 15 is being driven, microcontroller 16 may turn switch 20 off temporarily as indicated by an off portion 29 of signal 28 in FIG. 7. The motor of actuator 15 may keep on rotating due to inertia. The rotating of the motor may generate back electromotive force, which may be observable in a graph of FIG. 7 as a steady voltage at portion 37 of signal 35 after some of the transients 36 disappear. Signal 35 may be sensed on the AD2 line of microcontroller 16 for processing. Lower BEMF may indicate higher motor current. A diode 34 at the input of actuator 15 may limit the magnitude of the transients 36.

Figure 7:
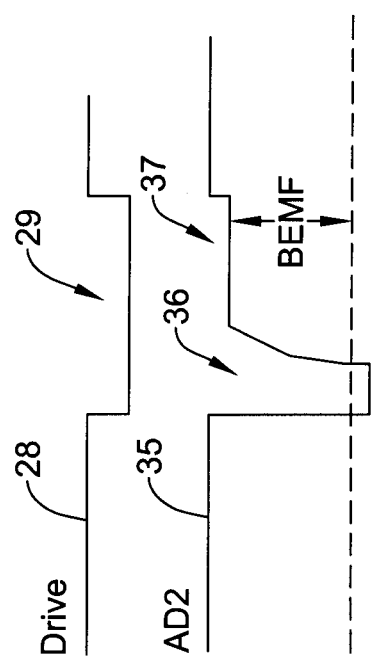
FIG. 7 is a diagram of a graph showing a back electromotive force from a motorized actuator used to determine a magnitude of current to an actuator.

Several such current measuring sequences, as exemplified by FIGS. 5 and 7, may be executed during the course of energizing the actuator. Each such sequence provides AD2 signal that may be used by the microcontroller to calculate instantaneous actuator current levels. Microcontroller 16 may use the calculated consecutive current levels to construct signal such as signal 19 in FIG. 2 and calculate the integral in Equation 1.

In the present specification, some of the matter may be of a hypothetical or prophetic nature although stated in another manner or tense.

Although the present system has been described with respect to at least one illustrative example, many variations and modifications will become apparent to those skilled in the art upon reading the specification. It is therefore the intention that the appended claims be interpreted as broadly as possible in view of the prior art to include all such variations and modifications.

What is claimed is:

1. A diagnostic system for an energy storage device and actuator assembly, comprising:
    an energy storage device;
    a current to voltage converter connected to the energy storage device;
    an actuator connected to the current to voltage converter;
    a drive control mechanism connected to the energy storage device and the actuator; and
    a microcontroller connected to the drive control mechanism, the energy storage device and the current to voltage converter; and
    wherein the micro controller is for indicating health of the actuator and the energy storage device by determining a failure mode of the actuator and the energy storage device using an estimated capacity of the energy storage device.

2. The system of claim 1, wherein the actuator is for driving a damper and/or a valve.

3. The system of claim 1, wherein:
    the microcontroller detects a first voltage across the energy storage device and a second voltage at the current-to-voltage converter;
    the second voltage indicates an amount of current to the actuator; and
    the microcontroller provides an indication of a capacity of the energy storage device from the first and second voltages.

4. The system of claim 3, wherein the capacity is compared to previously stored capacities or an absolute threshold to determine if the capacity of the energy storage device is normal.

5. The system of claim 4, wherein the amount of current to the actuator is compared to previously stored values or an absolute threshold to determine if the amount of current is normal.

6. The system of claim 1, further comprising a service switch connected between both the current-to-voltage converter and drive control mechanism and the actuator.

7. The system of claim 6, wherein:
    the microcontroller detects a first voltage across the energy storage device; and
    a constant first voltage during actuator energization indicates that the service switch is open.

8. The system of claim 6, wherein a capacitance of the energy storage device may be estimated as $$C \approx \frac{\int_0^T I_{ACTUATOR}(t)dt}{FirstVoltageDrop}$$

C is the capacitance;
T is duration of time while the actuator is energized with energy from the energy storage device;
$I_{ACTUATOR}$ represents current draw by the actuator;
the first voltage drop is an amount of change of a first voltage during T; and
the microcontroller implements an algorithm to solve the equation.

9. The system of claim 8, wherein:
    if $$\int_0^T I_{ACTUATOR}(t)dt$$

is equal to about zero then the service switch is open;
if $$\int_0^T I_{ACTUATOR}(t)dt$$

is larger than it is under normal conditions, then there is at least a partial failure of the actuator; and
    if C is smaller than it is under normal conditions, then there is at least a partial failure of the energy storage device.

10. A diagnostic system for an actuator and power system having diagnostics, comprising:
    an actuator;
    an energy storage device;
    a service switch connected to the actuator
    a control switch connected to the service switch and the energy storage device;
    a microcontroller connected to the energy storage device for sensing a first voltage, connected to the actuator for sensing a second voltage, and connected to the control switch for controlling a connection between the energy storage device and the actuator; and
    wherein the first and second voltages are monitored by the microcontroller to indicate health of the energy storage device and/or the actuator.

11. The system of claim 10, further comprising a converter capacitor across an input of the actuator for sensing the second voltage.

12. The system of claim 11, wherein:
    the microcontroller disconnects the actuator from the energy storage device via the control switch while the actuator is being driven; and
    the second voltage decreases at a rate proportional to the current to the actuator from the converter capacitor.

13. The system of claim 12, wherein:
    the rate indicates a level of current to the actuator; and
    the level of current is indicative of health of the actuator.

14. The system of claim 13, wherein:
    the first voltage declines at a rate proportional to current being discharged from the energy storage device to the actuator; and
    the rate of decline of the first voltage is indicative of health of the energy storage device.

15. The system of claim 14, wherein if the first voltage does not decline, then the service switch is open.

16. The system of claim 13, if the level of current to the actuator is about zero, the service switch is open.

17. The system of claim 15, wherein the microcontroller calculates from the first and second voltages the health of the actuator, the energy storage device and whether the service switch is open or closed.

18. A system for determining health of components in an actuator energy storage device, comprising:
    an energy storage device;
    a drive switch connected to the energy storage device;

a service switch connected to the drive switch, the service switch is configured to be manually operated by a user to disable automatic actuator control;

an actuator connected to the service switch; and a microcontroller connected to the energy storage device, the drive switch and the actuator; and wherein the microcontroller is for:

facilitating automatic control of the actuator; and for monitoring health of the actuator using an actuator current determined using a measured back electromotive force of the actuator.

19. The system of claim 18, wherein the microcontroller is for monitoring health of the energy storage device.

20. The system of claim 19, wherein:

the actuator comprises a motor;

if the motor is driven by current, the drive switch may disconnect the current from the motor;

upon disconnection of the current, the motor keeps rotating due to inertia;

while rotating, the motor generates a back electromotive force; and a magnitude of the back electromotive force is indicative of the current driving the motor.

21. The system of claim 20, further comprising a diode connected across an input of the motor to limit a magnitude of transients resulting from interrupting the motor current by the drive switch.

22. The system of claim 20, wherein:

the microcontroller detects the magnitude of the back electromotive force, and indicates a magnitude of current to run the motor;

the magnitude of the current to run the motor is compared to previously stored magnitudes or an absolute threshold of a current to run the motor; and as the health of the actuator becomes worse, the magnitude of the motor current becomes greater than the previously stored magnitudes or an absolute threshold of a current to run the motor.

23. The system of claim 18, wherein the microcontroller leaves the actuator in a desired position and indicates a failure mode if further actuator positioning is found non-reliable upon detecting compromised health of energy storage device and/or actuator.

* * * * *